United States Patent
Hsieh et al.

(10) Patent No.: US 9,299,927 B2
(45) Date of Patent: Mar. 29, 2016

(54) MEMORY CELL HAVING RESISTANCE VARIABLE FILM AND METHOD OF MAKING THE SAME

(71) Applicant: TAIWAN SEMICONDUCTOR MANUFACTURING COMPANY, LTD., Hsinchu (TW)

(72) Inventors: Ching-Pei Hsieh, Zhudong Township (TW); Yu-Hsing Chang, Taipei (TW); Chern-Yow Hsu, Chu-Bei (TW); Shih-Chang Liu, Alian Township (TW); Chia-Shiung Tsai, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/969,375

(22) Filed: Aug. 16, 2013

(65) Prior Publication Data

US 2015/0048297 A1     Feb. 19, 2015

(51) Int. Cl.
*H01L 45/00* (2006.01)

(52) U.S. Cl.
CPC ............ *H01L 45/1253* (2013.01); *H01L 45/08* (2013.01); *H01L 45/1233* (2013.01); *H01L 45/146* (2013.01); *H01L 45/16* (2013.01); *H01L 45/1608* (2013.01)

(58) Field of Classification Search
CPC .................. H01L 27/10894; H01L 27/10897; H01L 29/94; H01L 27/2436; H01L 23/522; H01L 23/5223; H01L 21/768; H01L 45/04; H01L 28/40; H01L 27/10852; H01L 45/08; H01L 45/1233; H01L 45/1675; H01L 45/146; H01L 45/06
See application file for complete search history.

(56) References Cited

U.S. PATENT DOCUMENTS

| | | | |
|---|---|---|---|
| 7,400,006 B1* | 7/2008 | Rinerson et al. | 257/295 |
| 2008/0089104 A1* | 4/2008 | Tanaka et al. | 365/53 |
| 2009/0231910 A1* | 9/2009 | Liu et al. | 365/163 |
| 2010/0110758 A1 | 5/2010 | Li et al. | |
| 2011/0175051 A1* | 7/2011 | Song et al. | 257/4 |
| 2011/0291066 A1* | 12/2011 | Baek et al. | 257/4 |

OTHER PUBLICATIONS

Wong, H.-S. Philip, et al., "Metal-Oxide RRAM", vol. 100, No. 6, Jun. 2012, Proceedings of the IEEE, pp. 1951-1970.
Office Action dated Apr. 28, 2014 from corresponding application No. DE 10 2013 109 523.2.

* cited by examiner

*Primary Examiner* — David Vu
*Assistant Examiner* — Mouloucoulaye Inoussa
(74) *Attorney, Agent, or Firm* — Hauptman Ham, LLP

(57) ABSTRACT

A manufacture includes a first electrode having an upper surface, a second electrode having a lower surface directly over the upper surface of the first electrode, a resistance variable film between the first electrode and the second electrode, and a first conductive member on and surrounding an upper portion of the second electrode.

21 Claims, 7 Drawing Sheets

MEMORY CELL HAVING RESISTANCE VARIABLE FILM AND METHOD OF MAKING THE SAME

BACKGROUND

In integrated circuit (IC) devices, resistive random access memory (RRAM) is an emerging technology for next generation non-volatile memory devices. RRAM refers to a memory structure including an array of RRAM cells each storing a bit of data using resistance, rather than electronic charge. In some applications, an RRAM cell includes a resistance variable layer, which is an insulating material capable of being configured to provide a conductive path through a filament formed after application of a predetermined threshold voltage. Once the filament is formed, the filament is operable to be set (i.e., re-formed, resulting in a lower resistance across the RRAM cell) or reset (i.e., broken, resulting in a high resistance across the RRAM) by appropriately applied voltages. The low and high resistance states thus are utilized to indicate a digital signal of "1" or "0," and thereby provide a non-volatile memory cell that can store a bit.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1A:
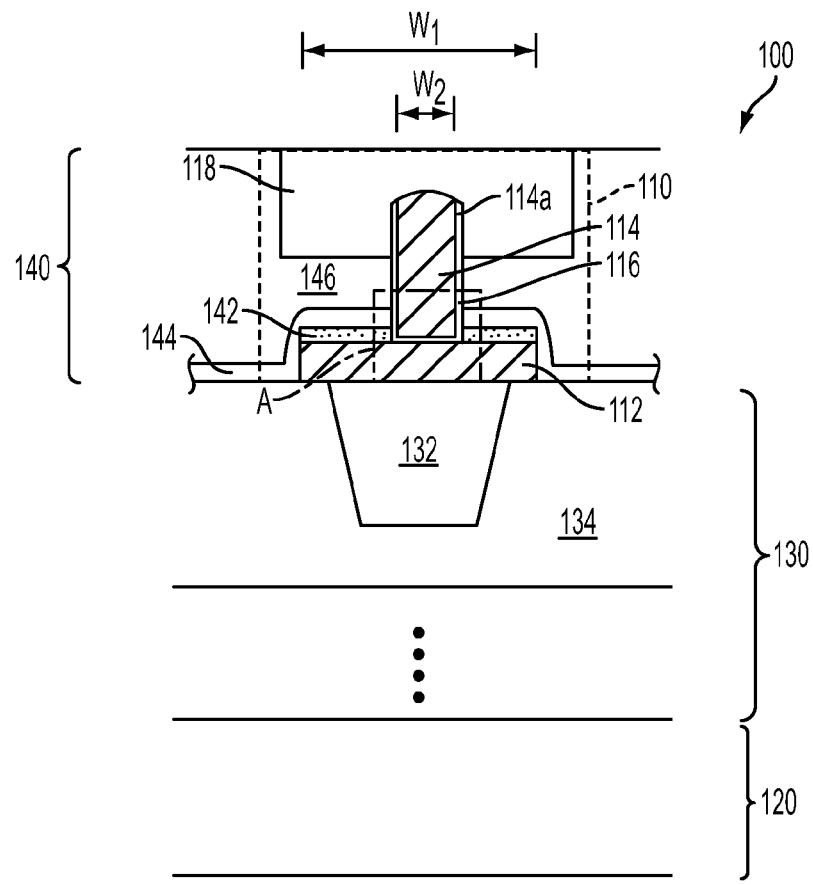
FIG. 1A is a cross-sectional view of a portion of an electrical device including an RRAM cell in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1B:
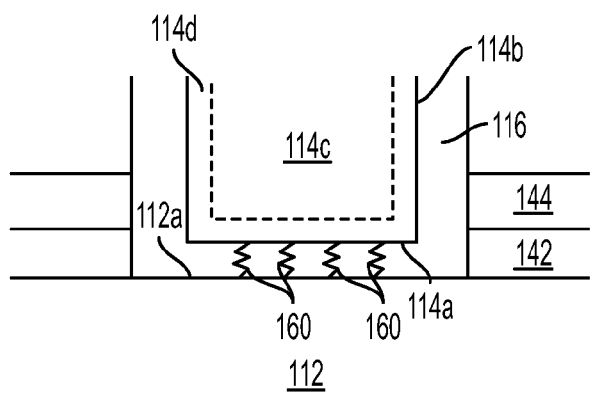
FIG. 1B is an enlarged view of region A in FIG. 1 in accordance with one or more embodiments.

FIG. 1A is a cross-sectional view of a portion of an electrical device 100 including an RRAM cell 110 in accordance with one or more embodiments. FIG. 1B is an enlarged view of region A in FIG. 1 in accordance with one or more embodiments. Device 100 includes a substrate 120, one or more interconnection layers 130 over substrate 120, and RRAM cell 110 over interconnection layers 130. RRAM cell 110 is formed within another interconnection layer 140 above interconnection layers 130.

RRAM cell 110 includes a first electrode 112, a second electrode 114 directly over first electrode 112, a resistance variable film 116 between first electrode 112 and second electrode 114, and a conductive member 118 on and surrounding an upper portion of second electrode 114. Resistance variable film 116 extends between an upper surface 112a (FIG. 1B) of first electrode 112 and a lower surface 114a of second electrode 114 and further along a side surface 114b of second electrode 114. RRAM cell 110 further includes a hard mask layer 142 over first electrode 112 and surrounding a lower portion of second electrode 114, an etch stop layer 144 covering first electrode 112 and hard mask layer 142, and a dielectric layer 146 over first electrode 112, hard mask layer 142, and etch stop layer 144 and surrounding second electrode 114 and conductive member 118. Etch stop layer 144 and dielectric layer 146 extend beyond the portion occupied by RRAM cell 110 in the interconnection layer 140. In some embodiments, hard mask layer 142 is omitted.

In some embodiments, conductive member 118 is formed by first performing an etching process to define an opening (374 in FIG. 3H) in dielectric layer 146. By having the upper portion of second electrode 114 extend upwardly and protruding a bottom surface 374a of opening 374 for forming conductive member 118, there is no need for forming a via opening for reaching second electrode 114. Therefore, compared with a configuration that a via opening is formed for reaching an top electrode of a RRAM cell, the portion of resistance variable film 116 sandwiched between upper surface 112a of first electrode 112 and lower surface 114a of second electrode 114 according to the embodiments described herein is less likely to be affected or damaged by an etching process for forming the via opening.

In some embodiments, first electrode 112 and/or second electrode 114 are electrically coupled to one or more electrical components on substrate 120 though the one or more layers of interconnection layers 130. In some embodiments, first electrode 112 has a circular shape or a polygon shape when it is viewed from the top of the RRAM cell 110. In some embodiments, first electrode 112 has one or more layers of conductive materials. In some embodiments, first electrode 112 has a material comprising platinum (Pt), aluminum, copper, titanium nitride (TiN), gold (Au), titanium (Ti), tantalum (Ta), tantalum nitride (TaN), tungsten (W), tungsten nitride (WN), or combinations thereof. In some embodiments, first electrode 112 has a width W1 ranging from 70 nm to 300 nm. In some embodiments, second electrode 114 has one or more layers of conductive materials. In some embodiments, second electrode 114 has a circular shape or a polygon shape when it is viewed from the top of the RRAM cell 110. In some embodiments, second electrode 114 has a material comprising Pt, Al, Cu, TiN, Au, Ti, Ta, TaN, W, WN, or combinations thereof. In some embodiments, second electrode 114 has a width W2 ranging from 20 nm to 100 nm.

In some embodiments, second electrode 114 includes a core portion 114c and a capping layer 114d surrounding core portion 114c and extending between core portion 114c and resistance variable film 116. In some embodiments, core portion 114c has a material comprising Ti, Ta, TiN, or TaN. In some embodiments, capping layer 114d has a material comprising Ti, Pt, or ruthenium (Ru).

Substrate 120 herein generally refers to a bulk substrate on which various layers and device structures are formed. In some embodiments, the bulk substrate includes silicon or a compound semiconductor, such as GaAs, InP, Si/Ge, or SiC.

Examples of the layers include dielectric layers, doped layers, polysilicon layers, or conductive layers. Examples of the device structures include transistors, resistors, and/or capacitors, which may be interconnected through one or more interconnect layers 130, interconnection layer 140, and/or one or more interconnect layers above interconnection layer 140 to additional integrated circuits.

Interconnection layers 130 include various conductive lines and via plugs arranged to electrically coupling the active and passive electrical devices on substrate 120 and to electrically coupled to RRAM cell 110. As depicted in FIG. 1A, interconnection layers 130 include a conductive line 132 and a dielectric layer 134 surrounding the conductive line 132. Interconnection layer 140 is on dielectric layer 134. First electrode 112 of RRAM cell 110 is electrically coupled to the conductive line 132, which is in turn electrically coupled with one or more of active and passive electrical devices on substrate 120. In some embodiments, the one or more interconnection layers 130 are omitted, and interconnection layer 140 is on substrate 120. In some embodiments, one or more other interconnection layers, passivation layers, and bump structures are formed over interconnection layer 140.

In some embodiments, dielectric layers 134 and 146 has a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low dielectric constant (low-k) dielectric material, or combinations thereof. In some embodiments, conductive line 132 has a material including Al, Cu, Ti, Ta, W, molybdenum (Mo), TaN, TiN, WN, metal silicide, silicon, or combinations thereof. In some embodiments, the etching stop layer 144 includes a dielectric material such as silicon carbide (SiC) or silicon oxy-nitride (SiON).

In some embodiments, resistance variable film 116 has a material comprising a high dielectric constant (high-k) dielectric material, a binary metal oxide, or a transition metal oxide. In some embodiments, resistance variable film 116 has a thickness ranging from 1 nm to 10 nm. As depicted in FIG. 1B, resistance variable film 116 is capable of being processed to form one or more "filaments" 160 to provide a conductive path such that resistance variable film 116 has a low resistance characteristic between upper surface 112a of first electrode and lower surface 114a of second electrode 114. In some embodiments, the filaments 160 is formed by lining-up defect (e.g. oxygen) vacancies in a bottom portion of resistance variable film 116 between upper surface 112a of first electrode 112 and lower surface 114a of second electrode 114. In some embodiments, filaments 160 are formed by applying a voltage level greater than a predetermined threshold "forming voltage." Once filaments 160 are formed, filaments 160 remain present in the resistance variable film 116. Other operations (reset operation and set operation) disconnect or reconnect the resistance variable film 116 using a set voltage and/or a reset voltage having voltage levels less than the forming voltage.

Figure 2:
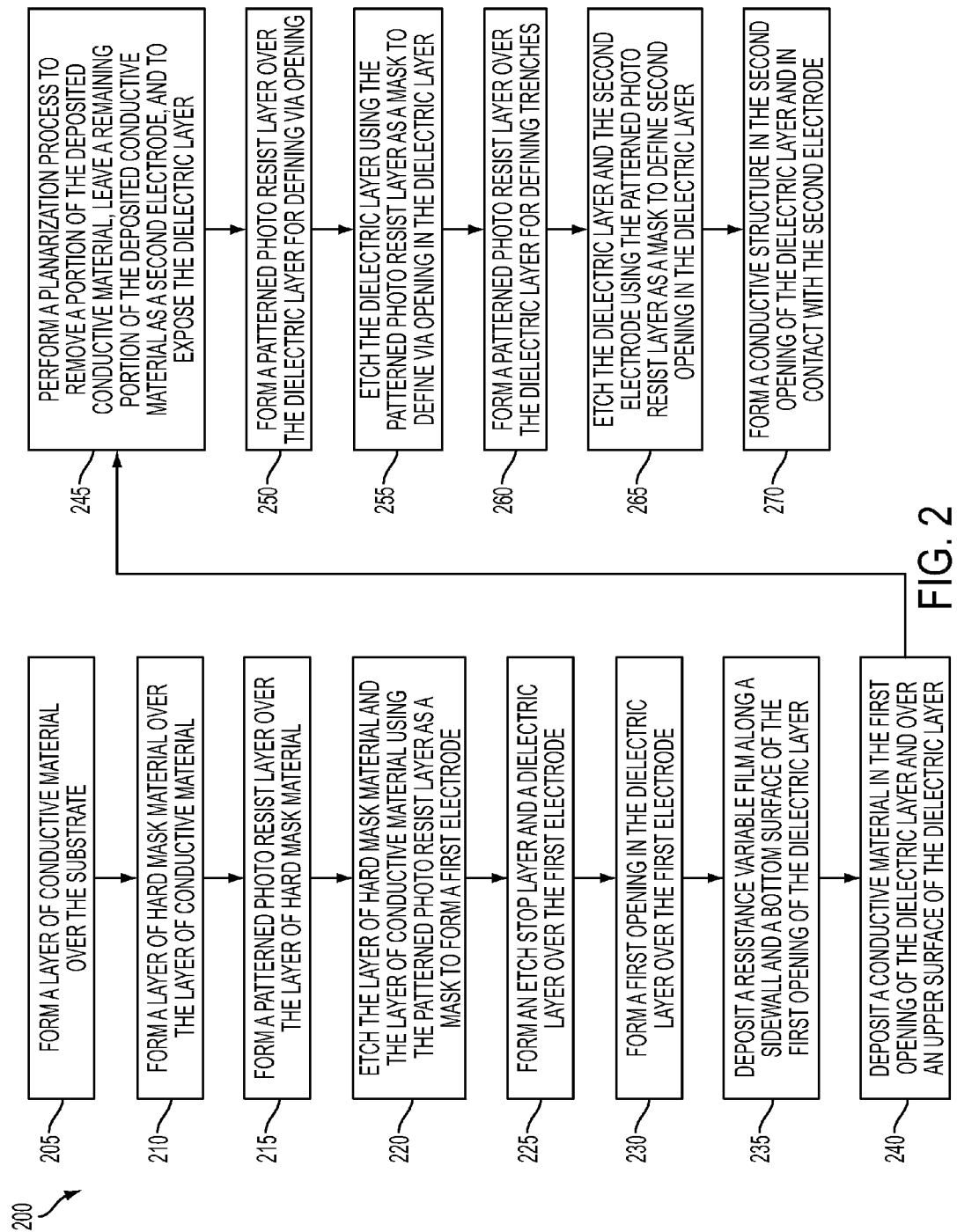
FIG. 2 is a flow chart of a method of making an RRAM cell in accordance with one or more embodiments.

FIG. 2 is a flow chart of a method 200 of making an RRAM cell 110 in accordance with one or more embodiments. FIGS. 3A-3H are cross-sectional views of a portion of an electrical device 100 including an RRAM cell 110 at various stages of manufacture in accordance with one or more embodiments. Components similar to those depicted in FIGS. 1A and 1B are given the same reference numbers. It is understood that additional operations may be performed before, during, and/or after the method 200 depicted in FIG. 2, and that some other processes may only be briefly described herein.

Figure 3A:
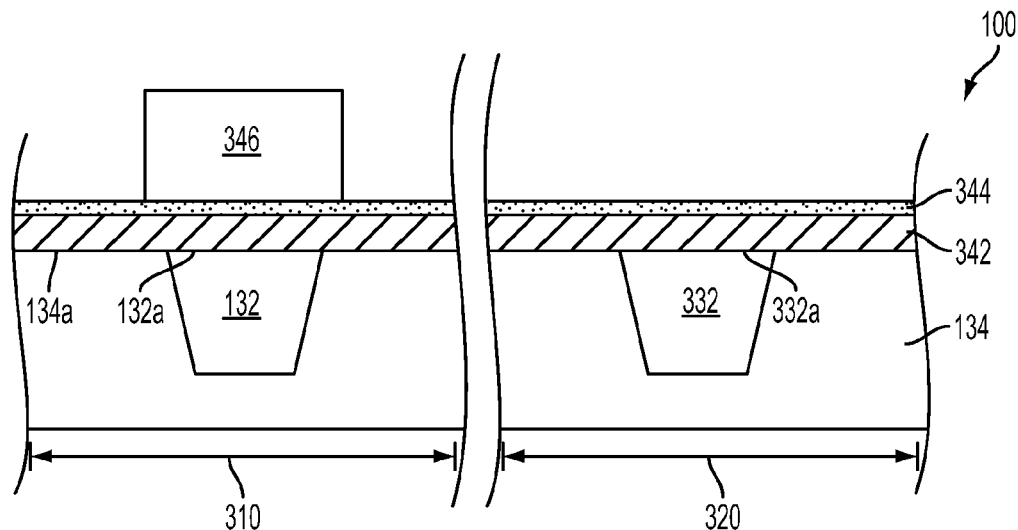
FIGS. 3A-3I are cross-sectional views of a portion of an electrical device including an RRAM cell at various stages of manufacture in accordance with one or more embodiments.

FIG. 3A is a cross-sectional view of electrical device 100 after performing operations 205, 210, and 215. As depicted in FIG. 2 and FIG. 3A, electrical device 100 includes a memory region 310 and a periphery region 320. Electrical device 100 includes a dielectric layer 134 formed over a substrate 120 (FIG. 1). Dielectric layer 134 has a conductive line 132 formed in memory region 310 and a conductive line 332 formed in periphery region 320.

In some embodiments, dielectric layer 134 has a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low-k dielectric material, or combinations thereof. In some embodiments, dielectric layer 134 is formed by performing a chemical vapor deposition (CVD) process, an atomic layer deposition (ALD) process, a high density plasma CVD (HDPCVD) process, or a spin-on glass process.

In some embodiments, conductive lines 132 and 332 include Al, Cu, Ti, Ta, W, Mo, TaN, TiN, WN, metal silicide, silicon, or combinations thereof. In the embodiment depicted in FIG. 3A, conductive lines 132 and 332 are formed by lithography patterning and etching in the dielectric layer 134 and depositing one or more layers of conductive materials over the patterned dielectric layer 134, and subsequently performing a planarization process to form the conductive lines 132 and 332. Upper surfaces 132a and 332a of conductive lines 132 and 332 are substantially coplanar with an upper surface 134a of dielectric layer 134.

In operation 205, a layer of conductive material ("conductive layer 342") is formed over dielectric layer 134 and the substrate 120 in both memory region 310 and periphery region 320. In some embodiments, conductive layer 342 is only formed in memory region 310. In some embodiments, conductive layer 342 is formed using a process including electroless plating, sputtering, electro plating, PVD, or ALD. In some embodiments, conductive layer 342 has a material including Pt, Al, Cu, TiN, Au, Ti, Ta, TaN, W, WN, or combinations thereof. In some embodiments, conductive layer 342 has a thickness ranging from 10 nm to 100 nm.

In operation 210, a layer of hard mask material ("hard mask layer 344") is formed over the conductive layer 342 in both memory region 310 and periphery region 320. In operation 215, a patterned photo resist layer 346 is formed over the hard mask layer 344. In some embodiments, operation 210 is omitted, and patterned photo resist layer 346 is formed on conductive layer 342.

Figure 3B:
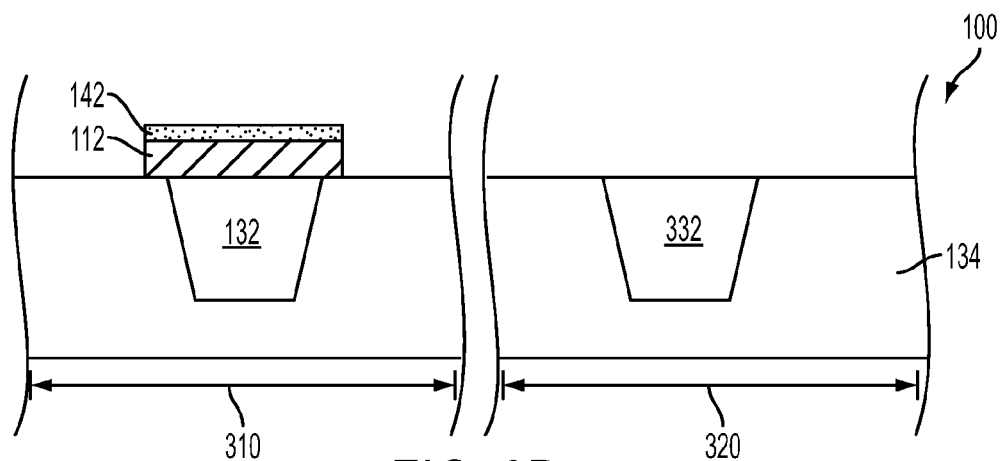

FIG. 3B is a cross-sectional view of electrical device 100 after performing operation 220. As depicted in FIG. 2 and FIG. 3B, in operation 220, conductive layer 342 and hard mask layer 344 are etched using patterned photo resist layer 346 as a mask. In some embodiments, operation 220 comprises performing a dry etching process or a wet etching process. After operation 220, first electrode 112 and hard mask layer 142 over first electrode 112 are formed over the dielectric layer 134. In some embodiments, dielectric layer 142 is omitted.

Figure 3C:
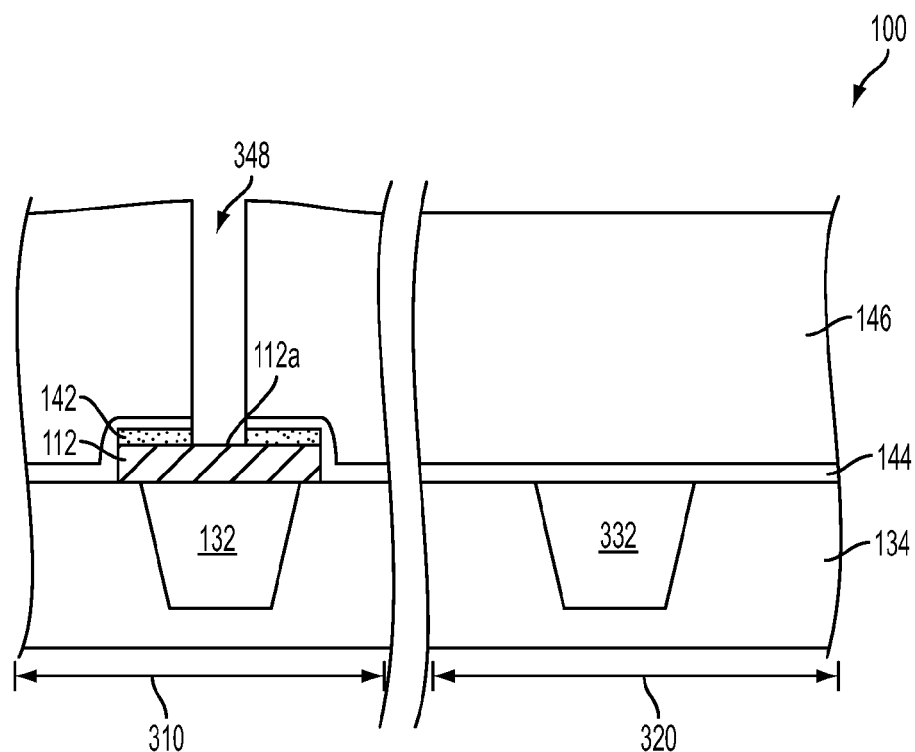

FIG. 3C is a cross-sectional view of electrical device 100 after performing operations 225 and 230. As depicted in FIG. 2 and FIG. 3C, in operation 225, an etch stop layer 144 and a dielectric layer 146 is formed over the first electrode 112 and blanket formed over dielectric layer 134 in memory region 310 and periphery region 320. The etching stop layer 144 formed over first electrode 112 is usable to prevent first electrode 112 from being oxidized. In some embodiments, the etching stop layer 144 includes a dielectric material such as SiC or SiON. In some embodiments, etch stop layer 144 is formed by performing a CVD process, an ALD process, or a plasma enhanced CVD (PECVD) process.

In some embodiments, dielectric layer 146 has a material including silicon oxide, fluorinated silica glass (FSG), carbon doped silicon oxide, tetra-ethyl-ortho-silicate (TEOS) oxide, phosphosilicate glass (PSG), borophosphosilicate glass (BPSG), BLACK DIAMOND® (APPLIED MATERIALS of Santa Clara, Calif.), amorphous fluorinated carbon, low-k dielectric material, or combinations thereof. In some embodiments, dielectric layer 146 is formed by performing a CVD process, an ALD process, a HDPCVD process, or a spin-on glass process.

As depicted in FIG. 2 and FIG. 3C, in operation 230, an opening 348 is formed in dielectric layer 146 over first electrode 112 and expose a portion of upper surface 112a of first electrode 112. In some embodiments, opening 348 extending through dielectric layer 146, etch strop layer 144, and hard mask layer 142. In some embodiments, opening 348 further extending into an upper portion of first electrode 112. The formation of opening 348 includes forming a patterned photo resist layer over dielectric layer 146 and then performing one or more etching processes to remove a portion of dielectric layer 146, etch strop layer 144, and hard mask layer 142 using the patterned photo resist layer over dielectric layer 146 as a mask.

Figure 3D:
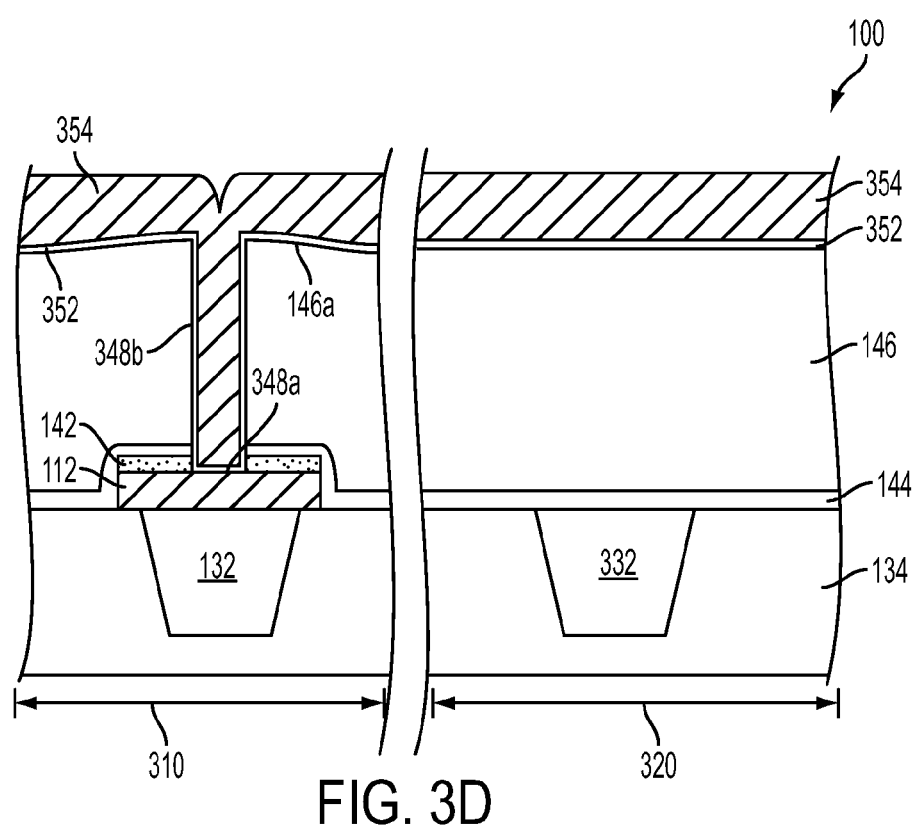

FIG. 3D is a cross-sectional view of electrical device 100 after performing operations 235 and 240. As depicted in FIG. 2 and FIG. 3D, in operation 235, a layer of resistance variable material ("resistance variable layer") 352 is deposited in opening 348 of dielectric layer 146 and over the exposed portion of first electrode 112. In some embodiments, resistance variable layer 352 extends over dielectric layer 146 in memory region 310 and periphery region 320. In some embodiments, resistance variable layer 352 is conformally deposited over a bottom surface 348a and a side surface 348b of opening 348 and over an upper surface 146a of dielectric layer 146. Resistance variable layer 352 has a resistivity capable of switching between a high resistance state and a low resistance state, by application of an electrical voltage. In some embodiments, the resistance variable layer 352 has a material including a high-k dielectric material, a binary metal oxide, or a transition metal oxide. In some embodiments, resistance variable layer 352 includes nickel oxide, titanium oxide, hafnium oxide, zirconium oxide, zinc oxide, tungsten oxide, aluminum oxide, tantalum oxide, molybdenum oxide, or copper oxide. In some embodiments, resistance variable layer 352 is formed by performing a pulse laser deposition (PLD) process or an ALD process, such as an ALD process with a precursor containing zirconium and oxygen. In some embodiments, resistance variable layer 352 has a thickness ranging from 1 nm to 10 nm.

As depicted in FIG. 2 and FIG. 3D, in operation 235, one or more layers of conductive materials ("conductive layer") 354 is deposited in opening 348 and over the resistance variable layer 352 and dielectric layer 146 in memory region 310 and periphery region 320. In some embodiments, conductive layer 354 is formed using a process including electroless plating, sputtering, electro plating, PVD, or ALD. In some embodiments, conductive layer 354 has a material including Pt, Al, Cu, TiN, Au, Ti, Ta, TaN, W, WN, or combinations thereof. In some embodiments, conductive layer 354 has a thickness ranging from 10 nm to 100 nm. In some embodiments, conductive layer 354 includes a layer of capping material for forming capping layer 114d (FIG. 1B) and a layer of conductive material for forming core portion 114c (FIG. 1B). In some embodiments, conductive material for forming core portion 114c includes Ti, Ta, TiN, or TaN. In some embodiments, material for forming capping layer 114c includes Ti, Pt, or Ru.

In some embodiments, no chemical mechanical polishing (CMP) process is performed during or between operations 225, 230, 235, and 240 to planarize the dielectric layer 146. In some embodiments, no planarization process is performed during or between operations 225, 230, 235, and 240 to planarize the dielectric layer 146.

Figure 3E:
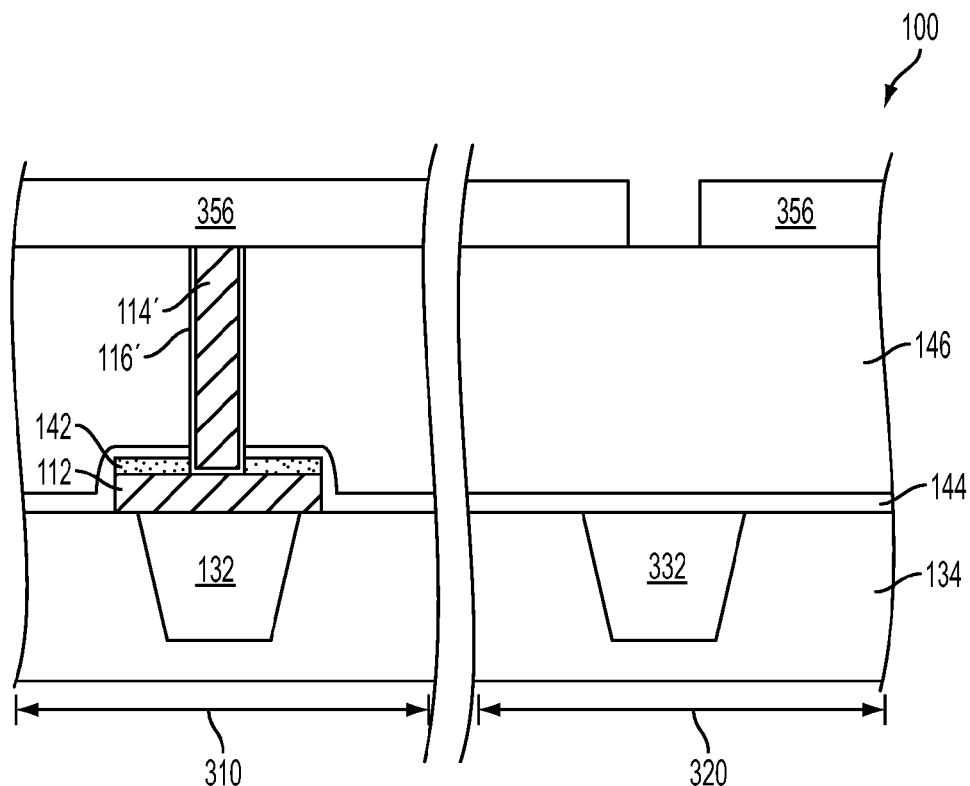

FIG. 3E is a cross-sectional view of electrical device 100 after performing operations 245 and 250. As depicted in FIG. 2 and FIG. 3E, in operation 245, a planarization process is performed to remove a portion of the deposited conductive layer 354 and to expose the dielectric layer 146. In some embodiments, operation 245 includes performing a CMP process. After operation 245, the remaining portion of the deposited conductive layer 354 is referred to as an intermediate electrode 114' for forming second electrode 114, and the remaining portion of the resistance variable layer 352 is referred to as intermediate film 116' for forming resistance variable film 116. Then, in operation 250, a patterned photo resist layer 356 is formed over dielectric layer 146 for defining one or more via openings over conductive line 332.

Figure 3F:
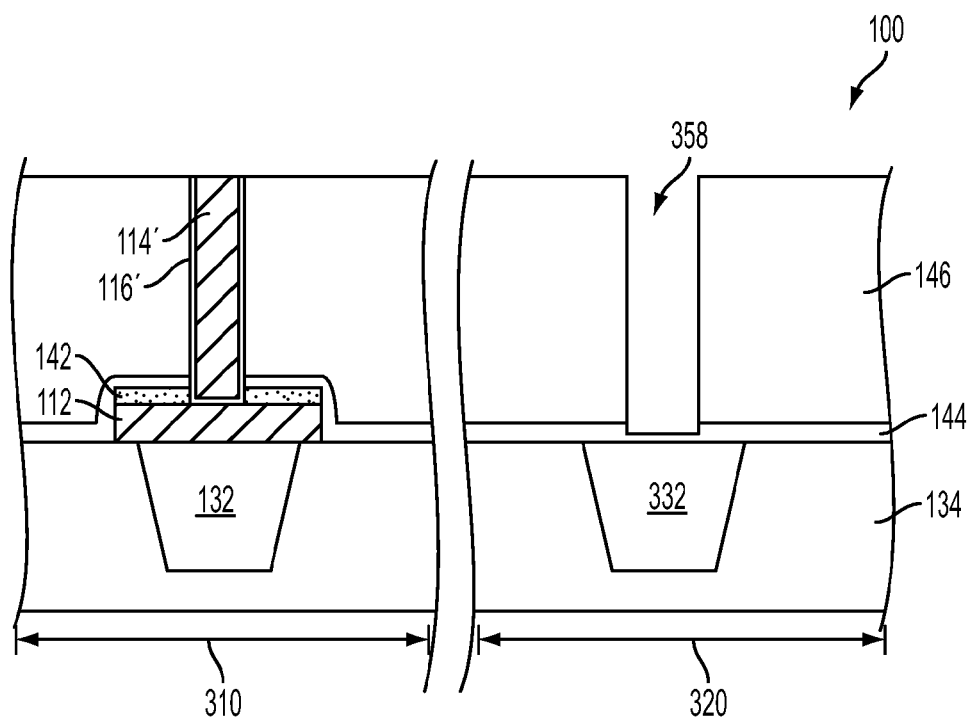

FIG. 3F is a cross-sectional view of electrical device 100 after performing operation 255. As depicted in FIG. 2 and FIG. 3F, in operation 255, dielectric layer 146 and a portion of etch stop layer 144 are etched using patterned photo resist layer 356 as a mask. As a result, a via opening 358 above conductive line 332 is defined in periphery region 320. In some embodiments, via opening 358 extends downwardly to expose an upper surface of conductive line 332. In some embodiments, operation 255 comprises performing a dry etching process or a wet etching process. After performing the etching for forming via opening 358, operation 255 further includes removing patterned photo resist layer 356 from the upper surface of dielectric layer 146.

Figure 3G:
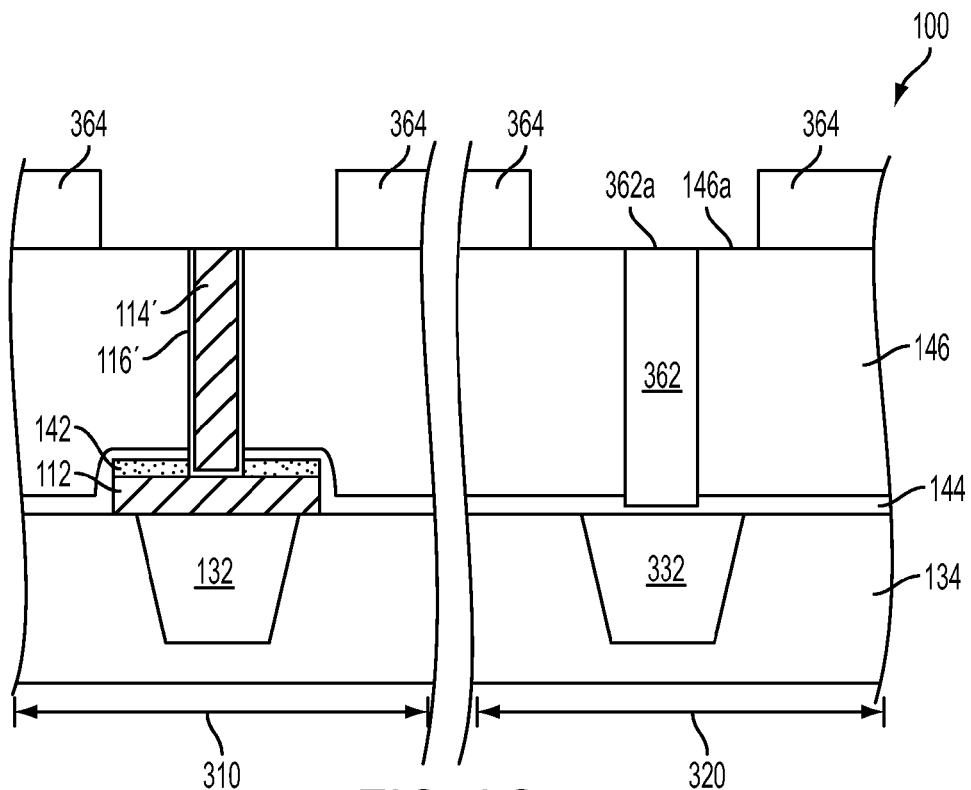

FIG. 3G is a cross-sectional view of electrical device 100 after performing operation 260. As depicted in FIG. 2 and FIG. 3G, in operation 260, a dielectric material is filled in via opening 362 to form a sacrificial via plug 362. An upper surface 362a of sacrificial via plug 362 is substantially coplanar with the upper surface 146a of dielectric layer 146. In some embodiments, sacrificial via plug 362 includes a bottom anti-reflection coating (BARC) material. Then, in operation 260, a patterned photo resist layer 364 is formed over dielectric layer 146 for defining one or more trench opening over conductive line 332 in periphery region 320 and intermediate electrode 114' in memory region 310.

Figure 3H:
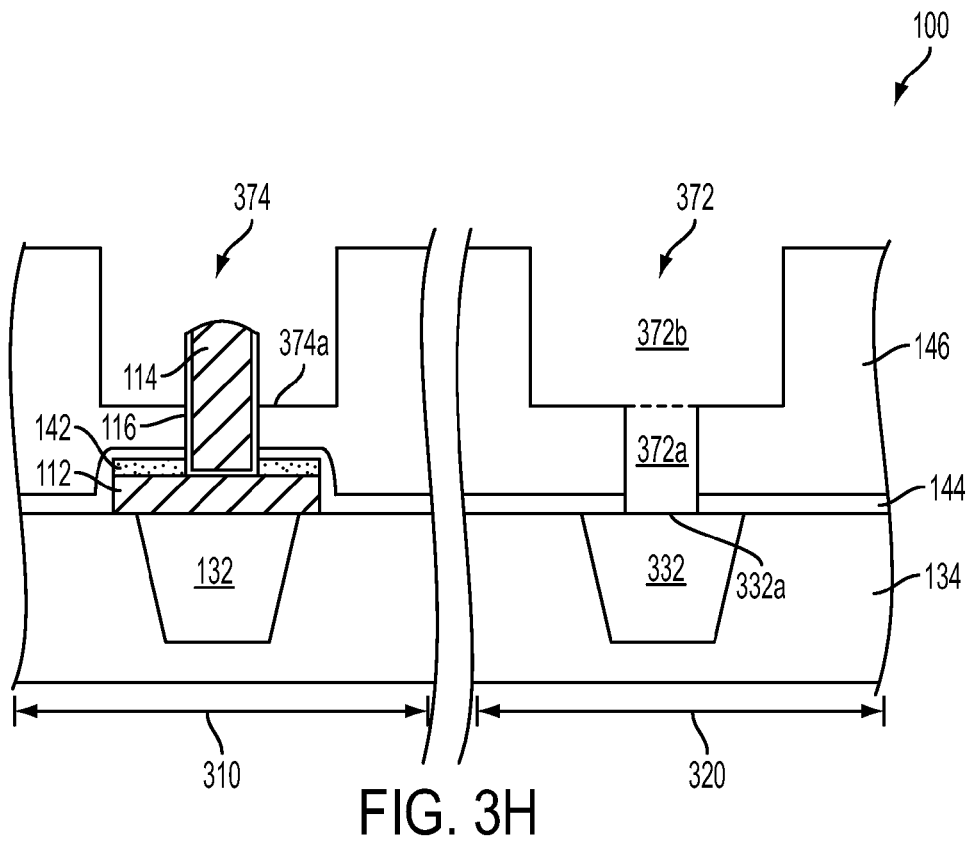

FIG. 3H is a cross-sectional view of electrical device 100 after performing operation 265. As depicted in FIG. 2 and FIG. 3H, in operation 265, a portion of dielectric layer 146, sacrificial via plug 362, and a portion of etch stop layer 144 over periphery region 320 are etched using patterned photo resist layer 364 as a mask in order to define opening 372 in periphery region 320. In some embodiments, opening 372 is also referred to as a combination of a via opening 372a and a trench opening 372b. Opening 372 exposes an upper surface 332a of conductive line 332. In some embodiments, operation 265 comprises performing a dry etching process or a wet etching process. Also, a portion of dielectric layer 146, an upper portion of intermediate electrode 114', and an upper portion of intermediate variable film 116' over memory region 320 are etched using patterned photo resist layer 364 as a mask in order to define opening 374 in memory region 310. The etching process is arranged to provide proper selectivity between the dielectric layer 146, intermediate electrode 114', and intermediate variable film 116' such that dielectric layer 146 is etched at a rate greater than that of removing intermediate electrode 114' and intermediate variable film 116'.

After performing the etching, operation 255 further includes removing patterned photo resist layer 364 from the upper surface of dielectric layer 146. The remaining portion of intermediate electrode 114' becomes second electrode 114, and the remaining portion of intermediate film 116' becomes resistance variable film 116. An upper portion of second electrode 114 and an upper portion of resistance variable film 116 protrude form a bottom surface 374a of opening 374.

Figure 3I:
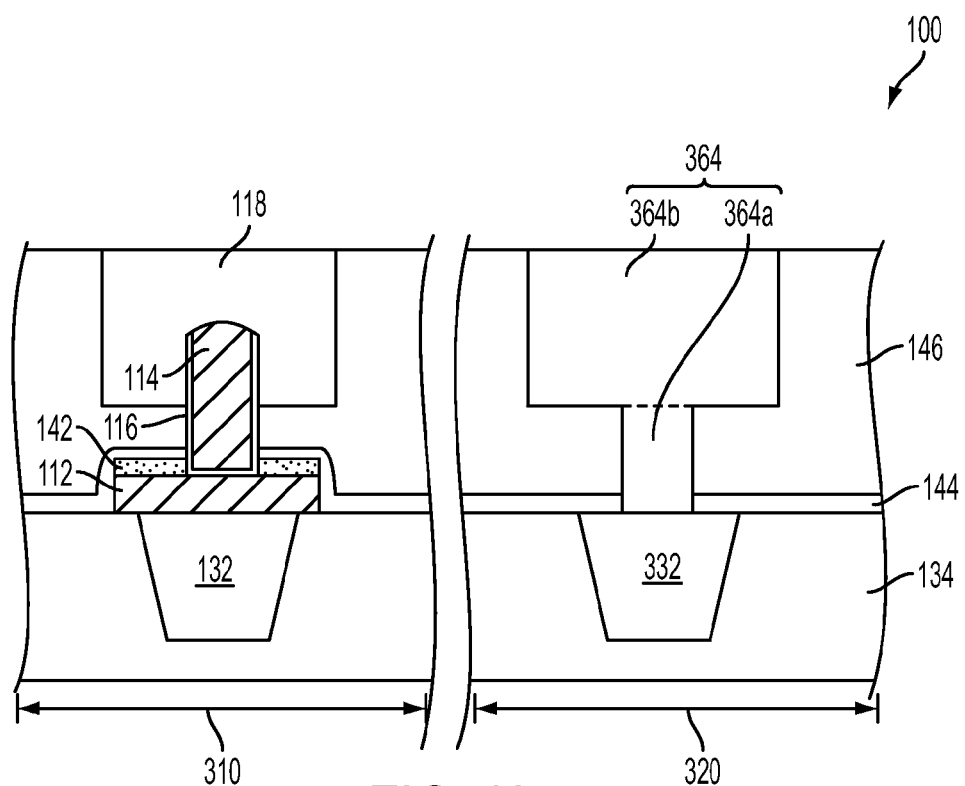

FIG. 3I is a cross-sectional view of electrical device 100 after performing operation 270. As depicted in FIG. 2 and FIG. 3I, in operation 270, a conductive material is deposited to fill opening 372 to form conductive member 364 and to fill opening 374 to form conductive member 118. Conductive member 364 is also referred to as a combination of via plug 364a and conductive line 364b on via plug 364a. In some embodiments, the conductive material for filling openings 372 and 374 includes Al, Cu, Ti, Ta, W, molybdenum (Mo), TaN, TiN, WN, metal silicide, silicon, or combinations thereof. In some embodiments, conductive member 118 being substantially level with conductive line 364b of conductive member 364.

After operation 270, the resulting structure in memory region 310 has a similar structure to electrical device 100 depicted in FIG. 1A.

In accordance with one embodiment, a manufacture includes a first electrode having an upper surface, a second electrode having a lower surface directly over the upper surface of the first electrode, a resistance variable film between the first electrode and the second electrode, and a first conductive member on and surrounding an upper portion of the second electrode.

In accordance with another embodiment, a manufacture includes a first electrode having an upper surface, a second electrode having a sidewall and a lower surface, and a resistance variable film between the first electrode and the second electrode. The lower surface of the second electrode is directly over the upper surface of the first electrode. The resistance variable film extends along the sidewall of the second electrode.

In accordance with another embodiment, a method includes forming a first electrode over a substrate. A dielectric layer is formed over the first electrode. The dielectric layer has a first opening defined therein exposing a portion of an upper surface of the first electrode. A resistance variable film is formed in the first opening of the first dielectric layer and over the exposed portion of the first electrode. A second electrode is formed in the first opening of the first dielectric layer. At least a portion of the resistance variable film is between the first electrode and the second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacture, comprising:
a first electrode having an upper surface;
a second electrode having a lower surface over the upper surface of the first electrode;
a resistance variable film between the first electrode and the second electrode; and
a first conductive member on and surrounding an upper portion of the second electrode, wherein a lowest portion of the first conductive member is lower than an uppermost portion of the second electrode, and the first conductive member is in contact with a sidewall of the resistance variable film.

2. The manufacture of claim 1, wherein the second electrode further comprises a sidewall, and the resistance variable film extends along the sidewall of the second electrode.

3. The manufacture of claim 1, further comprising:
a hard mask layer over the first electrode and surrounding a lower portion of the second electrode.

4. The manufacture of claim 1, further comprising:
a substrate;
a dielectric layer over the substrate, the first electrode being over the dielectric layer; and
a second conductive member over the dielectric layer, the second conductive member comprising a via plug and a conductive line directly on the via plug, the first conductive member being substantially level with the conductive line of the second conductive member.

5. The manufacture of claim 1, wherein the lower surface of the second electrode has a width ranging from 20 nm to 100 nm.

6. The manufacture of claim 1, wherein the first electrode or the second electrode has a thickness ranging from 10 nm to 100 nm.

7. The manufacture of claim 1, wherein the first electrode or the second electrode has a material comprising platinum (Pt), aluminum, copper, titanium nitride (TiN), gold (Au), titanium (Ti), tantalum (Ta), tantalum nitride (TaN), tungsten (W), tungsten nitride (WN), or combinations thereof.

8. The manufacture of claim 1, wherein the resistance variable film has a thickness ranging from 1 nm to 10 nm.

9. The manufacture of claim 1, wherein the resistance variable film has a material comprising a high-k dielectric material, a binary metal oxide or a transition metal oxide.

10. A manufacture, comprising:
a first electrode having an upper surface;
a second electrode having a sidewall and a lower surface over the upper surface of the first electrode, wherein a width of the first electrode is different from a width of the second electrode;
a resistance variable film between the first electrode and the second electrode and extending along the sidewall of the second electrode; and
a conductive member on and surrounding an upper portion of the second electrode,
wherein the conductive member is in contact with a sidewall of the resistance variable film.

11. The manufacture of claim 10, further comprising:
a hard mask layer over the first electrode and surrounding a bottom portion of the second electrode.

12. The manufacture of claim 10, wherein the lower surface of the second electrode has a width ranging from 20 nm to 100 nm.

13. The manufacture of claim 10, wherein the first electrode or the second electrode has a thickness ranging from 10 nm to 100 nm.

14. The manufacture of claim 10, wherein the first electrode or the second electrode has a material comprising platinum (Pt), aluminum, copper, titanium nitride (TiN), gold (Au), titanium (Ti), tantalum (Ta), tantalum nitride (TaN), tungsten (W), tungsten nitride (WN), or combinations thereof.

15. The manufacture of claim 10, wherein the resistance variable film has a thickness ranging from 1 nm to 10 nm.

16. The manufacture of claim 10, wherein the resistance variable film has a material comprising a high-k dielectric material, a binary metal oxide or a transition metal oxide.

17. A manufacture, comprising:
 a conductive line embedded in a dielectric layer;
 a first electrode over the conductive line;
 a second electrode over the first electrode, wherein the second electrode comprises sidewalls and a bottom portion;
 a resistance variable film over the sidewalls and between the first electrode and the bottom portion of the second electrode; and
 a conductive member over the second electrode, wherein the conductive member surrounds a portion of sidewalls of the second electrode, and the conductive member is in contact with a sidewall of the resistance variable film.

18. The manufacture of claim 17, wherein the resistance variable film has a thickness ranging from 1 nm to 10 nm.

19. The manufacture of claim 17, wherein the first electrode or the second electrode has a material comprising platinum (Pt), aluminum, copper, titanium nitride (TiN), gold (Au), titanium (Ti), tantalum (Ta), tantalum nitride (TaN), tungsten (W), tungsten nitride (WN), or combinations thereof.

20. The manufacture of claim 17, wherein the first electrode or the second electrode has a thickness ranging from 10 nm to 100 nm.

21. The manufacture of claim 17, wherein the resistance variable film has a material comprising a high-k dielectric material, a binary metal oxide or a transition metal oxide.

* * * * *